United States Patent [19]

McEachern et al.

[11] Patent Number: 5,270,637

[45] Date of Patent: Dec. 14, 1993

[54] IMPULSE DIRECTION DETECTOR FOR AC POWER SYSTEMS

[75] Inventors: Alexander McEachern, Oakland; Richard Piehl, San Ramon, both of Calif.

[73] Assignee: Basic Measuring Instruments, Foster City, Calif.

[21] Appl. No.: 918,436

[22] Filed: Jul. 22, 1992

[51] Int. Cl.⁵ ............................................. G01R 19/14
[52] U.S. Cl. ....................................... 324/102; 324/127
[58] Field of Search ............ 324/102, 111, 133, 103 P; 340/661; 364/483, 487; 361/86

[56] References Cited

U.S. PATENT DOCUMENTS

| | | | |
|---|---|---|---|
| 3,753,089 | 8/1973 | Gunn et al. | 324/52 |
| 3,986,115 | 10/1976 | Huang | 324/102 |
| 3,986,116 | 10/1976 | Smith et al. | 324/102 |
| 4,187,461 | 2/1980 | Cox | 324/102 |
| 4,642,563 | 2/1987 | McEachern et al. | 324/111 |
| 4,754,407 | 6/1988 | Nolan | 340/661 |
| 4,992,725 | 2/1991 | Komatsu et al. | 324/111 |

Primary Examiner—Vinh Nguyen
Attorney, Agent, or Firm—Haverstock, Medlen & Carroll

[57] ABSTRACT

An impulse direction detector for AC power systems determines the direction of high-frequency impulses on an AC (alternating current) power line by measuring impulse parameters on each side of a low-pass filter inserted in series with the power line. The low-pass filter is formed by two capacitors and a series inductance. The series inductance is formed by placing a magnetic core around the power line. The impulse parameters are measured on either side of the magnetic core and are then transmitted to a microprocessor. The microprocessor determines if the impulse is above a threshold level and which side of the magnetic core the impulse originated from. The microprocessor then displays the direction of the impulse and communicates the result to other digital systems.

15 Claims, 4 Drawing Sheets

IMPULSE DIRECTION DETECTOR FOR AC POWER SYSTEMS

BACKGROUND OF THE INVENTION

1. Field of the Invention

This invention relates to devices for detecting power line disturbances and more particularly to devices for analyzing high frequency impulses that occur on AC (alternating current) power lines.

2. Description of Prior Art

When a temporary and intermittent event occurs on an alternating current (AC) power system with a frequency content that is orders of magnitude above the fundamental frequency of the system, it is commonly called an impulse. Impulses may be caused by lightning, inductive loads turning off, capacitive loads turning on, static electricity, and wiring faults, as well as other less common faults. Impulses can both disrupt and damage sensitive loads.

There are many commercially available instruments for measuring parameters of power line impulses. These parameters may include time of occurrence, peak voltage amplitude, rise time, and oscillographic signature. One such commercially available instrument is the Basic Measuring Instruments Model 8800 PowerScope.

An impulse parameter that is especially useful for diagnosing the cause of an impulse is its direction: that is, the direction one must travel from the measuring point along the measured conductor in order to find the source of the impulse. For example, if the impulse is measured at the AC power service entrance of a building, this parameter can indicate whether the impulse originated inside the building or on the utility distribution grid. Portable impulse direction measurements also allow an investigator to track down the source of a series of impulses by judicious selection of measurement sites.

Techniques for impulse direction measurements have been the subject of active investigation for almost twenty years. One technique for determining impulse direction is to measure the polarity of a voltage impulse, while simultaneously measuring the polarity of its associated current impulse. If the polarities match, the impulse was travelling in one direction; if the polarities are opposite, the impulse was travelling in the other direction. This technique is the basis of Gunn et al. in U.S. Pat. No. 3,753,089; Huang in U.S. Pat. No. 3,986,115; and Smith et al. in U.S. Pat. No. 3,986,116. Cox in U.S. Pat. No. 4,187,461 measures the polarities of the leading edges of a voltage impulse and its associated current impulse, then proceeds to compare the polarities in the same way.

However, practical, accurate, and reliable implementations of these techniques have been elusive. One barrier has been the difficulty of making accurate impulse current measurements on AC power lines. On 60 Hertz power lines, impulses typically have frequency content in the 100 kiloHertz to 2 megaHertz range. Standard current transformers with cores and windings optimized for 60 Hertz measurements perform poorly at 2 megaHertz. On the other hand, cores and windings that are optimized for 2 megaHertz may saturate in the presence of large 60 Hertz magnetic fields. Consequently, accurately and unambiguously measuring impulse direction by comparing the polarity of corresponding voltage and current impulses has been difficult outside of the laboratory.

It is the object of the present invention to measure impulse direction without requiring high frequency current measurements.

SUMMARY OF THE INVENTION

An impulse direction detector for AC power systems determines the direction of high-frequency impulses on an AC (alternating current) power line by measuring impulse parameters on each side of a low-pass filter inserted in series with the power line. The low-pass filter is formed by two capacitors and a series inductance. The series inductance is formed by placing a magnetic core around the power line. The impulse parameters are measured on either side of the magnetic core and are then transmitted to a microprocessor. The microprocessor determines if the impulse is above a threshold level and which side of the magnetic core the impulse originated from. The microprocessor then displays the direction of the impulse and communicates the result to other digital systems.

DETAILED DESCRIPTION OF A PREFERRED EMBODIMENT

Figure 1:
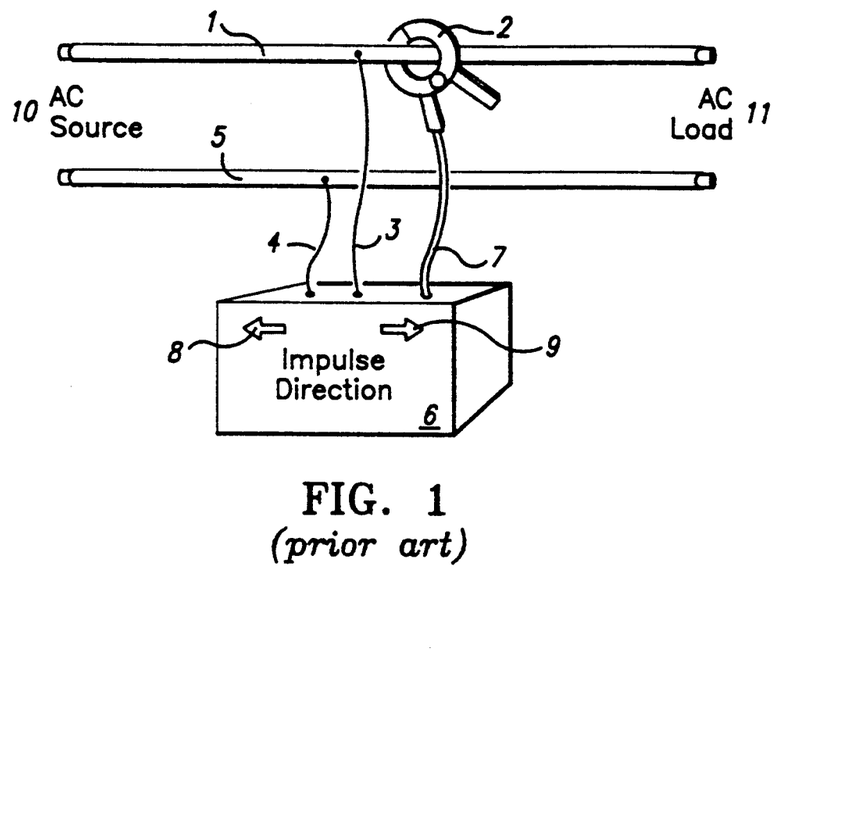
FIG. 1 shows prior art for impulse direction measuring instruments.

FIG. 1 shows prior art for impulse direction measuring instruments. In FIG. 1, we see a line conductor 1 and a neutral conductor 5 carrying power from an AC source 10 such as a electric power utility to an AC load 11 such as a commercial building. The impulse direction measuring instrument 6 has two voltage connections: one voltage connection line 3 coupled to the line conductor 1, and a second voltage connection line 4 coupled to the neutral conductor 5. A current transducer 2 measures the current in the line conductor 1 then sends a signal proportional to the line current to the impulse direction measuring instrument 6 through the current connection cable 7. The impulse direction measuring instrument 6 detects voltage impulses between the voltage connection lines 3 and 4, and also detects current impulses from the current transducer 2 through the current connection cable 7. When an impulse occurs, the impulse direction measuring instrument 6 compares the polarity of the voltage and current impulses. If the polarities are both positive or both negative, the impulse direction detection instrument lights one of the direction indicators 9; if one polarity is positive and the other is negative, the impulse direction detection instrument lights the other direction indicator 8.

Figure 3:
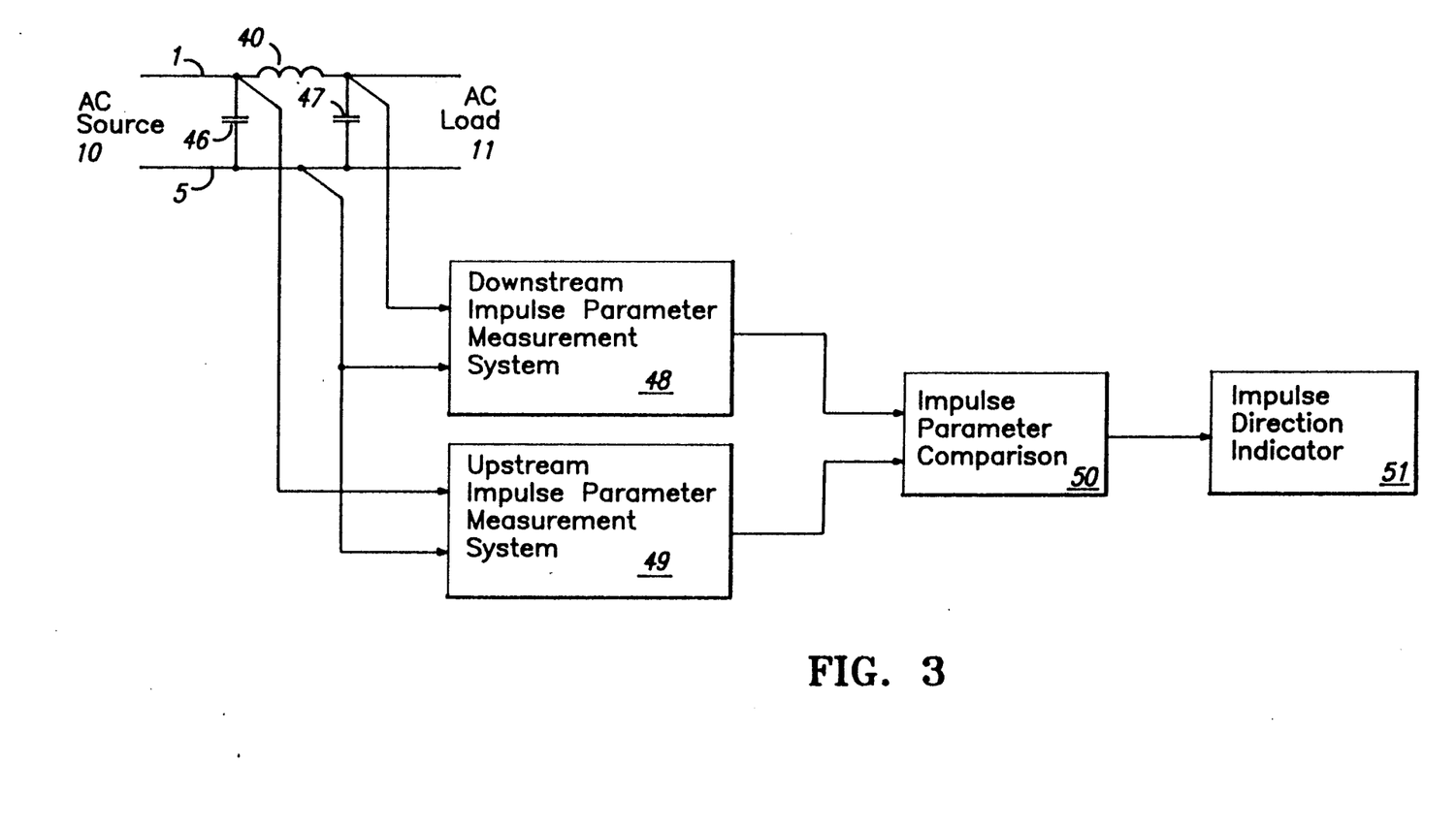
FIG. 3 shows a block diagram of an embodiment of the present invention.

One way to determine the direction an impulse is traveling is to insert two filters into the line as shown in FIG. 3 and described in more detail below. Unfortunately, this approach generally will require that the power line be temporarily interrupted while the inductor is inserted. Such an interruption is unacceptable to many types of power consumers having certain types of loads, e.g. a hospital life support system, computer, elevator and the like.

Figure 2:
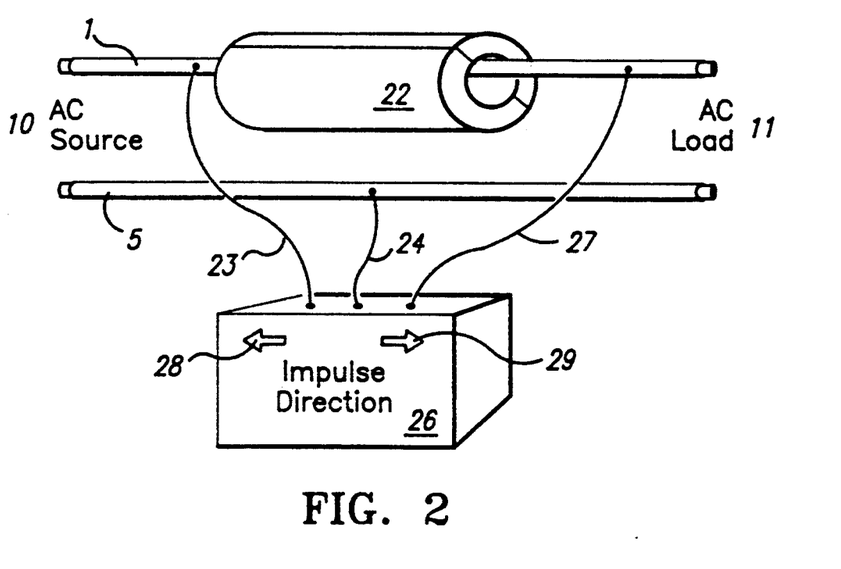
FIG. 2 shows an isometric view of an embodiment of the present invention.

FIG. 2 illustrates an embodiment of the present invention shown in such a way as to contrast with the prior art in FIG. 1. In FIG. 2 a line conductor 1 and a neutral conductor 5 also carry power from an AC source 10 such as an electric power utility to an AC load 11 such as a commercial building. A magnetic core 22 is clamped around the line conductor 1, effectively forming a single-turn inductor in series with the line conductor 1 without needing to interrupt the power supply. The impulse direction measuring instrument 26 has three voltage connections: one voltage connection line 23 coupled to the line conductor 1 upstream from the magnetic core 22, a second voltage connection line 27 coupled to the line conductor 1 downstream from the magnetic core 22, and a third voltage connection 24 to the neutral conductor 5. The impulse direction detection instrument 26 measures the parameters of voltage impulses that occur between the voltage connection lines 23 and 24, and also measures the parameters of simultaneous voltage impulses that occur between the voltage connection lines 27 and 24. A comparison of the parameters of these simultaneous voltage impulses, described more fully below, causes the impulse direction detection instrument 26 to light one of its two direction indicators 28 or 29.

FIG. 3 illustrates a summary block diagram of the present invention. AC power again flows from an AC source 10 to an AC load 11 through a line conductor 1 and a neutral conductor 5. The series inductance 40 is formed by the magnetic core 22 shown in FIG. 2. Two capacitors 46 and 47, along with the inductor 40, form a low-pass filter on the power line. In the preferred embodiment, the capacitors 46 and 47 are physically located within the impulse direction detection instrument 26 of FIG. 2. Two impulse parameter measurement systems 48 and 49 use techniques described more fully below to extract parameters such as peak impulse voltage and initial voltage rate-of-change from impulses occurring simultaneously upstream and downstream of the are applied to a voltage attenuator 64 with a ratio of 1000 to 1. The voltage attenuator 64 reduces the amplitude of power line impulses to a level that is convenient for further processing by standard integrated circuits. The outputs of the voltage attenuator 64 are applied to the inputs of a differential amplifier 65. A high-pass filter 66 then removes the fundamental voltage sine wave from the signal, leaving only impulses. A peak hold circuit 68 captures the peak voltage of the impulse. The output of a rate-of-change extractor circuit 67 is applied to a second peak hold circuit 69. Both peak hold circuits 68 and 69 are periodically reset by the microprocessor 80 through a digital reset line 70.

Figure 4:
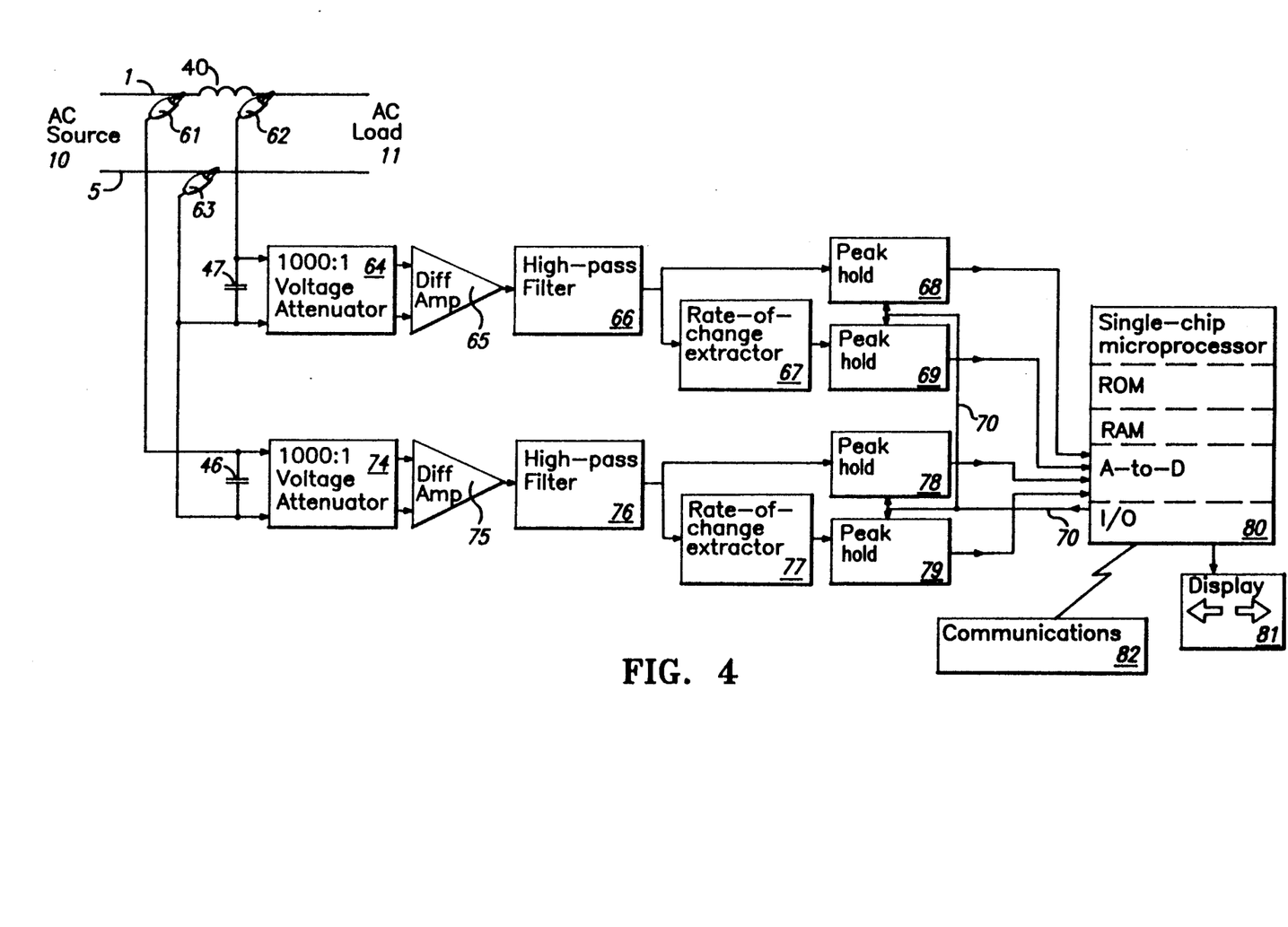
FIG. 4 shows a detailed block diagram of an embodiment of the present invention.

The blocks 74 through 79 are functionally identical to the blocks 64 through 69, and are used to capture the upstream impulse parameters.

Figure 5:
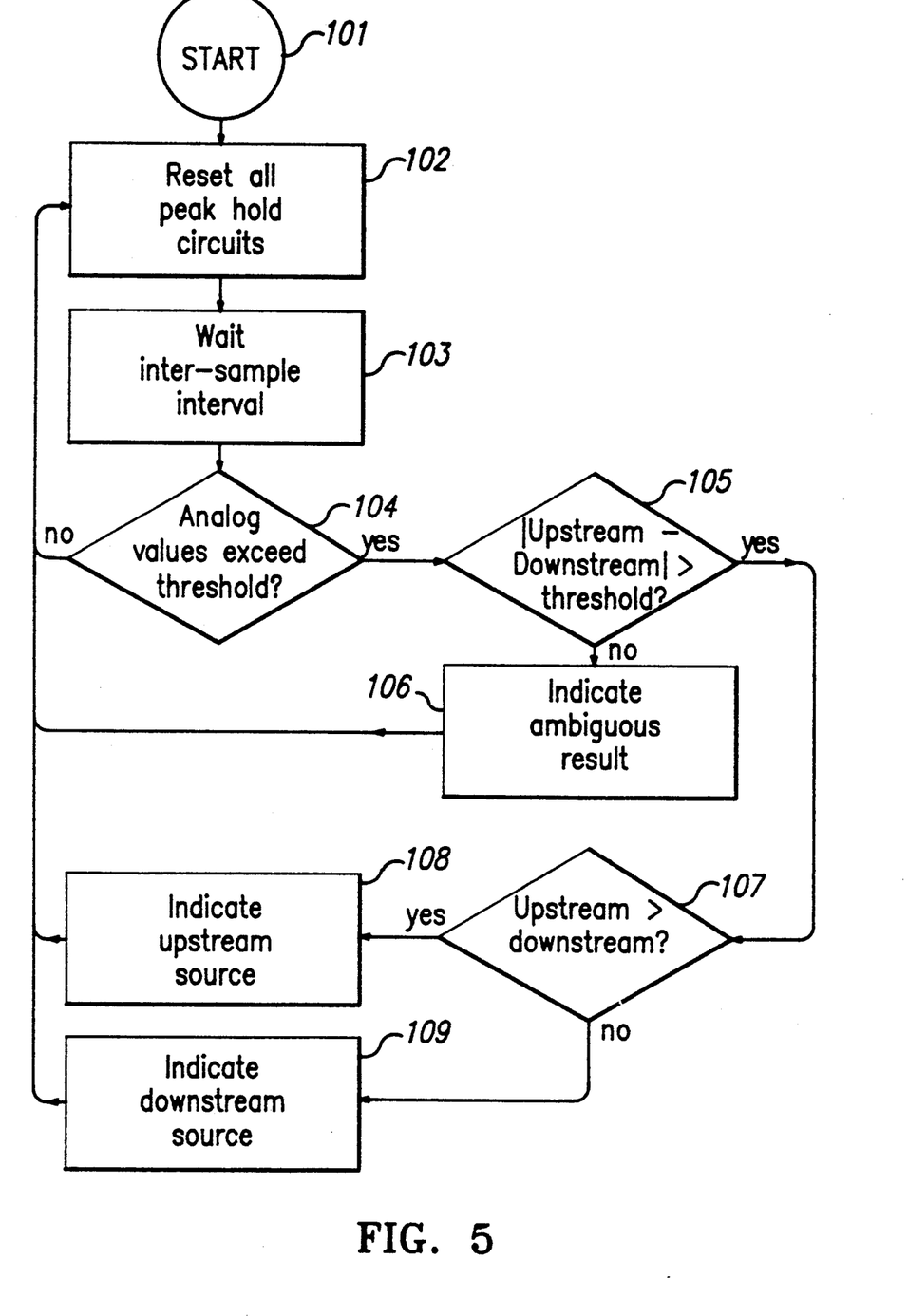
FIG. 5 shows a flow diagram of the key algorithm executed by the microprocessor.

A single-chip microprocessor 80, such as a Motorola model number 68HC05M4, containing Read Only Memory (ROM), Random Access Memory (RAM), Analog-to-Digital Conversion channels (A-to-D), and Input/Output digital lines (I/O) executes the algorithm shown in FIG. 5 to determine impulse direction. After it determines an impulse direction, it displays the direction on a light-emitting-diode display 81 and communicates it to other digital systems through the serial communications channel 82. The communications channel 82 also allows the microprocessor 80 to receive set-up data such as thresholds used in the algorithm shown in FIG. 5.

FIG. 5 illustrates a flow diagram of the key algorithm executed by the microprocessor 80. The algorithm enters an infinite loop at the START 101. In the Block 102, the algorithm resets all four peak hold circuits 68, 69, 78, 79 by strobing the reset line 70. The algorithm then waits at the block 103 for a period of time to elapse, typically one-tenth the period of the fundamental frequency of the power line. The block 104 converts inductor 40.

The impulse parameter comparison block 50 determines if simultaneous impulses have been detected by the impulse parameter measurement systems 48 and 49. If only one of the two measurement systems has detected an impulse, the impulse parameter comparison block 50 instructs the impulse direction indicator 51 to indicate that the impulse originated on the side on which it was detected. If both impulse measurement systems 48 and 49 detected an impulse, the impulse parameter comparison block 50 examines the impulse parameters in a way described more fully in FIG. 4 and FIG. 5. If there is a substantial difference between the two sets of parameters, the impulse parameter comparison block 50 then instructs the impulse direction indicator 51 to indicate that side of the filter on which the impulse originated. Otherwise, the impulse parameter block 50 instructs the impulse direction indicator 51 to display an ambiguous result.

FIG. 4 illustrates a detailed block diagram of the invention. The clip leads 61, 62, and 63 connect the instrument to the power lines 1 and 5 on each side of the inductor 40 which is formed by the split magnetic core 22 of FIG. 2. The capacitors 46 and 47 form a low pass filter with the inductor 40. The blocks 64 through 69 comprise the Downstream Impulse Parameter Measurement System 48 of FIG. 3, and the blocks 74 through 79 comprise the Upstream Impulse Parameter Measurement System 49 of FIG. 3. A single-chip microprocessor 80 executes the algorithm described in FIG. 5, thus comprising the Impulse Parameter Comparison Block 50 of FIG. 3. The microprocessor 80 also controls a display block 81 and a communications block 82 which together comprise the Impulse Direction Indicator 51 of FIG. 3.

Examining FIG. 4 in more detail, it can be seen that impulses that occur on the downstream or load side of inductor 40 the four analog values from the four peak hold circuits 68, 69, 78, 79 to four digital values then compares each of them to a threshold. In the preferred embodiment, the threshold for the rate-of-change peak hold circuits 69, 79 is 20 volts per microsecond, and the threshold for the impulse peak hold circuits 68, 78 is 100 volts. These thresholds are given to illustrate one possible implementation of the invention as defined by the appended claims.

If none of the four peak hold values exceed the threshold, the Block 104 concludes that no impulse has occurred then returns control to the Block 102 where the loop recommences.

If the Block 104 detects that one of the four values exceeds a threshold, it concludes that an impulse has occurred and control is passed to the Block 105. The Block 105 determines if the absolute difference between the upstream impulse peak hold circuit 68 and its corresponding downstream peak hold circuit 78 exceeds a threshold, or alternatively determines if the absolute difference between the upstream rate-of-change peak hold circuit 69 and its corresponding downstream rate-of-change peak hold circuit 79 exceeds a threshold. In the preferred embodiment, the threshold for absolute difference between the rate-of-change peak hold circuits 69, 79 is 10 volts per microsecond, and the threshold for absolute difference between the impulse peak hold circuits 68, 78 is 50 volts. These thresholds are given to illustrate one possible implementation of the invention as defined by the appended claims.

If the absolute difference between the upstream and downstream values does not exceed the threshold, the Block 105 passes control to the Block 106, which indicates that the direction of the impulse cannot be determined. The Block 106 then passes control back to the block 102, and the loop recommences.

If the absolute difference between the upstream and downstream values does exceed the threshold, the Block 107 determines the appropriate direction indication then passes control to either the Block 108 or the Block 109. The Blocks 108 and 109 indicate the direction of the impulse using the Display 81 of FIG. 4 and communicate its direction through the Communications channel 82 of FIG. 4. The Blocks 108 and 109 then pass control to the Block 102, and the loop recommences.

In the preferred embodiment, the high pass filters 66 and 76 of FIG. 4 are implemented as 4-pole Butterworth filters with a corner frequency set to the expected fundamental frequency multiplied by 10. These values are given to illustrate one possible implementation of the invention as defined by the appended claims.

In the preferred embodiment, the rate-of-change extractors 67 and 77 are implemented as analog differentiators. In alternate embodiments, the rate-of-change parameter can be implemented digitally.

In the preferred embodiment, maximum sensitivity of the instrument is attained by maximizing the inductance of the series inductor 40. This inductance can be maximized by choosing a physical form for the magnetic core 22 that minimizes path length and maximizes cross-sectional area, such as a long aspect-ratio cylinder fitted closely around an AC power system cable. Any appropriate magnetic material, such as grain-oriented silicon steel, may be used for the magnetic core 22. An inductance of 100 microhenries is easily achievable with readily available grain-oriented silicon steel. With this inductance, a capacitance value of 1 microfarad or greater for the line filter capacitors 46 and 47 results in adequate signal levels at the impulse parameter measurement systems 48 and 49 for direction detection of standard power line impulses. These component values are given to illustrate one possible implementation of the invention as defined by the appended claims. It will be readily apparent to one reasonably skilled in the art that different values can be used for these components.

In an alternate embodiment of the invention, the magnetic core 22 is constructed as a spring-loaded clamp in a form similar to that of the clamp-on current transducer 2 to allow easy, temporary installation on a power conductor.

The sensitivity of the invention is proportional to the frequency content of the impulse; that is, the higher the frequency content, the larger the absolute difference between the impulse signals presented at the inputs of the impulse parameter measurement systems 48 and 49. The sensitivity of prior art impulse direction detection systems, such as that shown in FIG. 1, is inversely proportional to the frequency content of the impulse; that is, the lower the frequency content, the more likely that prior art impulse direction detectors will function properly. Therefore, in order to cover the full frequency spectrum of impulses, it may be desirable to combine both the present invention and prior art in a single instrument.

Various modifications may be made to the preferred embodiment without departing from the spirit and scope of the invention as defined by the appended claims.

We claim:

1. An instrument for measuring the direction of an impulse on an AC power line comprising:
   a. a low-pass filter having a first side and a second side coupled in series with the AC power line;
   b. means for measuring a first set of impulse parameters having a first initial rate of change of voltage with respect to time and first peak voltage, means for measuring a first set of impulse parameters coupled to the first side of the low-pass filter;
   c. means for measuring a second set of impulse parameters having a second initial rate of change of voltage with respect to time and a second peak voltage, means for measuring a second set of impulse parameters coupled to the second side of the low-pass filter; and
   d. means for comparing the first set of impulse parameters to the second set of impulse parameters to determine an impulse direction therefrom.

2. The instrument according to claim 1 further comprising means for indicating the impulse direction coupled to the means for comparing.

3. The instrument according to claim 1 wherein the low-pass filter comprises a series inductor and two shunt capacitors.

4. The instrument according to claim 1 wherein the means for comparing comprises means to determined if the first initial rate of change of voltage with respect to time is greater than the second initial rate of change of voltage with respect to time.

5. The instrument according to claim 1 wherein the means for comparing comprises means to determine if the first peak voltage is greater than the second peak voltage.

6. An impulse direction detector for measuring the direction of an impulse on an AC power line comprising:
   a. means for attenuating high-frequency signals coupled to the AC power line, the means for attenuating having a first side and a second side;
   b. means for measuring a first set of impulse parameters coupled to the power line and the first side of the means for attenuating;
   c. means for measuring a second set of impulse parameters coupled to the power line and the second side of the means of attenuating;
   d. means for comparing the first set of impulse parameters and the second set of impulse parameters to determine an impulse direction, the means for comparing coupled to the means for measuring a first set of impulse parameters and the means for measuring a second set of impulse parameters; and
   e. means for communicating the impulse direction coupled to the means for comparing.

7. The impulse direction detector as claimed in claim 6 wherein the means for attenuating high-frequency signals comprises a low-pass filter coupled in series with the AC power line.

8. The impulse direction detector as claimed in claim 7 wherein the low-pass filter further comprises a series inductor and two shunt capacitors.

9. The impulse direction detector as claimed in claim 8 wherein the series inductance has a value of 100 microhenries or more and the first and second line filter capacitors have a value of 1 microfarad.

10. The impulse direction detector as claimed in claim 6 wherein the means for communicating the impulse direction comprises a display and a serial communications channel.

11. An impulse direction detector for measuring the direction of an impulse on an AC power line between an AC source and an AC load comprising:
   a. a series inductance coupled to the power line and having a first side coupled to the AC source and a second side coupled to the AC load;
   b. a first line filter capacitor coupled to the power line on the AC load side of the series inductance;
   c. a second line filter capacitor coupled to the power line on the AC source side of the series inductance;
   d. a first voltage attenuator having an input and an output, the input coupled to the first line filter capacitor;
   e. a first differential amplifier having an input and an output, the input coupled to the output of the first voltage attenuator;
   f. a first high-pass filter having an input and an output, the input coupled to the output of the first differential amplifier;
   g. a first rate-of-change extractor having an input and an output, the input coupled to the output of the first high-pass filter;
   h. a first peak hold circuit having an input and an output, the input coupled to the output of the first high-pass filter and the input of the first rate-of-change extractor for capturing the peak voltage of the impulse on the load side of the series inductance;
   i. a second peak hold circuit having an input and an output, the input coupled to the output of the first rate-of-change extractor for capturing the peak rate-of-change on the load side of the series inductance;
   j. a second voltage attenuator having an input and an output, the input coupled to the second line filter capacitor;
   k. a second differential amplifier having an input and an output, the input coupled to the output of the second voltage attenuator;
   l. a second high-pass filter having an input and an output, the input coupled to the output of the second differential amplifier;
   m. a second rate-of-change extractor having an input and an output, the input coupled to the output of the second high-pass filter;
   n. a third peak hold circuit having an input and an output, the input coupled to the output of the second high-pass filter and the input of the second rate-of-change extractor for capturing the peak voltage of the impulse on the source side of the series inductance;
   o. a fourth peak hold circuit having an input and an output, the input coupled to the output of the second rate-of-change extractor for capturing the peak rate-of-change on the source side of the series inductance;
   p. a microprocessor coupled to the outputs of the first, second, third, and fourth peak hold circuits for determining the direction of the impulse;
   q. a reset line coupled to the first, second, third, and fourth peak hold circuits for resetting their values to measure another impulse;
   r. a display coupled to the microprocessor for displaying the direction of the impulse; and
   s. a serial communications channel coupled to the microprocessor for communicating the direction of the impulse.

12. The impulse direction detector according to claim 11 wherein the first and second high-pass filters are 4-pole Butterworth filters with a corner frequency set to the expected fundamental frequency multiplied by ten.

13. The impulse direction detector according to claim 11 wherein the first and second rate-of-change extractors are analog differentiators.

14. The impulse direction detector according to claim 11 wherein the series inductance and the first and second line filter capacitors together form a low-pass filter.

15. The impulse direction detector according to claim 14 wherein the series inductance has a value of 100 microhenries or more and the first and second line filter capacitors have a value of 1 microfarad, or greater.

* * * * *

UNITED STATES PATENT AND TRADEMARK OFFICE
CERTIFICATE OF CORRECTION

PATENT NO. : 5,270,637

DATED : 12/14/93

INVENTOR(S) : MCEACHERN ET AL.

Page 1 of 5

It is certified that error appears in the above-identified patent and that said Letters Patent is hereby corrected as shown below:

In Column 3, line 42 through Column 4, line 10: delete

"are applied to a voltage attenuator 64 with a ratio of 1000 to 1. The voltage attenuator 64 reduces the amplitude of power line impulses to a level that is convenient for further processing by standard integrated circuits. The outputs of the voltage attenuator 64 are applied to the inputs of a differential amplifier 65. A high-pass filter 66 then removes the fundamental voltage sine wave from the signal, leaving only impulses. A peak hold circuit 68 captures the peak voltage of the impulse. The output of a rate-of-change extractor circuit 67 is applied to a second peak hold circuit 69. Both peak hold circuits 68 and 69 are periodically reset by the microprocessor 80 through a digital reset line 70.

The blocks 74 through 79 are functionally identical to the blocks 64 through 69, and are used to capture the upstream impulse parameters.

A single-chip microprocessor 80, such as a Motorola model number 68HC05M4, containing Read Only Memory (ROM), Random Access Memory (RAM), Analog-to-Digital Conversion channels (A-to-D), and Input/Output digital lines (I/O) executes the algorithm shown in FIG. 5 to determine impulse direction. After it determines an impulse direction, it displays the direction on a light-emitting-diode display 81 and communicates it to other digital systems through the serial communications channel 82. The communications channel 82 also allows the microprocessor 80 to receive set-up data such as thresholds used in the algorithm shown in FIG. 5.

FIG. 5 illustrates a flow diagram of the key algorithm executed by the microprocessor 80. The algorithm enters an infinite loop at the START 101. In the Block 102, the algorithm resets all four peak hold circuits 68, 69, 78, 79 by

UNITED STATES PATENT AND TRADEMARK OFFICE
CERTIFICATE OF CORRECTION

PATENT NO. : 5,270,637

DATED : 12/14/93

INVENTOR(S) : MCEACHERN ET AL.

It is certified that error appears in the above-identified patent and that said Letters Patent is hereby corrected as shown below:

strobing the reset line 70. The algorithm then waits at the block 103 for a period of time to elapse, typically one-tenth the period of the fundamental frequency of the power line. The block 104 converts" and replace with

--inductor 40.

The impulse parameter comparison block 50 determines if simultaneous impulses have been detected by the impulse parameter measurement systems 48 and 49. If only one of the two measurement systems has detected an impulse, the impulse parameter comparison block 50 instructs the impulse direction indicator 51 to indicate that the impulse originated on the side on which it was detected. If both impulse measurement systems 48 and 49 detected an impulse, the impulse parameter comparison block 50 examines the impulse parameters in a way described more fully in FIG. 4 and FIG. 5. If there is a substantial difference between the two sets of parameters, the impulse parameter comparison block 50 then instructs the impulse direction indicator 51 to indicate that side of the filter on which the impulse originated. Otherwise, the impulse parameter block 50 instructs the impulse direction indicator 51 to display an ambiguous result.

FIG. 4 illustrates a detailed block diagram of the invention. The clip leads 61, 62, and 63 connect the instrument to the power lines 1 and 5 on each side of the inductor 40 which is formed by the split magnetic core 22 of FIG. 2. The capacitors 46 and 47 form a low pass filter with the inductor 40. The blocks 64 through 69 comprise the Downstream Impulse Parameter Measurement System 48 of FIG.3, and the blocks 74 through 79 comprise the Upstream Impulse Parameter Measurement System 49 of FIG.3. A single-chip microprocessor 80 executes the algorithm described in FIG. 5, thus comprising the Impulse Parameter Comparison Block 50 of FIG. 3. The microprocessor 80

UNITED STATES PATENT AND TRADEMARK OFFICE
CERTIFICATE OF CORRECTION

PATENT NO. : 5,270,637

DATED : 12/14/93

INVENTOR(S) : MCEACHERN ET AL.

It is certified that error appears in the above-identified patent and that said Letters Patent is hereby corrected as shown below:

also controls a display block 81 and a communications block 82 which together comprise the Impulse Direction Indicator 51 of FIG. 3.
    Examining FIG. 4 in more detail, it can be seen that impulses that occur on the downstream or load side of inductor 40--.

In Column 4, lines 10-48: delete

"inductor 40.
    The impulse parameter comparison block 50 determines if simultaneous impulses have been detected by the impulse parameter measurement systems 48 and 49.  If only one of the two measurement systems has detected an impulse, the impulse parameter comparison block 50 instructs the impulse direction indicator 51 to indicate that the impulse originated on the side on which it was detected.  If both impulse measurement systems 48 and 49 detected an impulse, the impulse parameter comparison block 50 examines the impulse parameters in a way described more fully in FIG. 4 and FIG. 5.  If there is a substantial difference between the two sets of parameters, the impulse parameter comparison block 50 then instructs the impulse direction indicator 51 to indicate that side of the filter on which the impulse originated.  Otherwise, the impulse parameter block 50 instructs the impulse direction indicator 51 to display an ambiguous result.
    FIG. 4 illustrates a detailed block diagram of the invention. The clip leads 61, 62, and 63 connect the instrument to the power lines 1 and 5 on each side of the inductor 40 which is formed by the split magnetic core 22 of FIG. 2.  The capacitors 46 and 47 form a low pass filter with the inductor 40.  The blocks 64 through 69 comprise the Downstream Impulse Parameter Measurement System 48 of FIG.3, and the blocks 74

UNITED STATES PATENT AND TRADEMARK OFFICE
CERTIFICATE OF CORRECTION

PATENT NO. : 5,270,637

DATED : 12/14/93

INVENTOR(S) : MCEACHERN ET AL.

It is certified that error appears in the above-identified patent and that said Letters Patent is hereby corrected as shown below:

through 79 comprise the Upstream Impulse Parameter Measurement System 49 of FIG.3. A single-chip microprocessor 80 executes the algorithm described in FIG. 5, thus comprising the Impulse Parameter Comparison Block 50 of FIG. 3. The microprocessor 80 also controls a display block 81 and a communications block 82 which together comprise the Impulse Direction Indicator 51 of FIG. 3.

Examining FIG. 4 in more detail, it can be seen that impulses that occur on the downstream or load side of inductor 40" and replace with

--are applied to a voltage attenuator 64 with a ratio of 1000 to 1. The voltage attenuator 64 reduces the amplitude of power line impulses to a level that is convenient for further processing by standard integrated circuits. The outputs of the voltage attenuator 64 are applied to the inputs of a differential amplifier 65. A high-pass filter 66 then removes the fundamental voltage sine wave from the signal, leaving only impulses. A peak hold circuit 68 captures the peak voltage of the impulse. The output of a rate-of-change extractor circuit 67 is applied to a second peak hold circuit 69. Both peak hold circuits 68 and 69 are periodically reset by the microprocessor 80 through a digital reset line 70.

The blocks 74 through 79 are functionally identical to the blocks 64 through 69, and are used to capture the upstream impulse parameters.

A single-chip microprocessor 80, such as a Motorola model number 68HC05M4, containing Read Only Memory (ROM), Random Access Memory (RAM), Analog-to-Digital Conversion channels (A-to-D), and Input/Output digital lines (I/O) executes the algorithm shown in FIG. 5 to determine impulse direction. After it determines an impulse direction, it displays the direction on a light-emitting-diode display 81 and communicates

UNITED STATES PATENT AND TRADEMARK OFFICE
CERTIFICATE OF CORRECTION

PATENT NO. : 5,270,637

DATED : 12/14/93

INVENTOR(S) : MCEACHERN ET AL.

It is certified that error appears in the above-identified patent and that said Letters Patent is hereby corrected as shown below:

it to other digital systems through the serial communications channel 82. The communications channel 82 also allows the microprocessor 80 to receive set-up data such as thresholds used in the algorithm shown in FIG. 5.

FIG. 5 illustrates a flow diagram of the key algorithm executed by the microprocessor 80. The algorithm enters an infinite loop at the START 101. In the Block 102, the algorithm resets all four peak hold circuits 68, 69, 78, 79 by strobing the reset line 70. The algorithm then waits at the block 103 for a period of time to elapse, typically one-tenth the period of the fundamental frequency of the power line. The block 104 converts--.

In Column 6, line 17: insert " a " after the word --and--.

In Column 6, line 36: delete "determined" and replace with --determine--.

Signed and Sealed this

Third Day of May, 1994

*Attest:*

BRUCE LEHMAN

*Attesting Officer*     *Commissioner of Patents and Trademarks*